US005493864A

United States Patent [19]
Pomerene et al.

[11] Patent Number: 5,493,864
[45] Date of Patent: Feb. 27, 1996

[54] APPARATUS FOR COOLING OR HEATING LIQUIDS AND METHOD OF USING SAME

[75] Inventors: Andrew T. S. Pomerene, New Fairfield, Conn.; Terence W. Spoor; Robert R. DeVenuto, both of Marlboro, N.Y.; Anthony V. DiStefano, New Windsor, N.Y.

[73] Assignee: On Demand Cooling Systems, Inc.

[21] Appl. No.: 259,783

[22] Filed: Jun. 14, 1994

[51] Int. Cl.$^6$ .............................. F25B 21/02; B67D 5/62; F28F 13/00
[52] U.S. Cl. ................................ 62/3.7; 62/3.64; 62/391; 165/146
[58] Field of Search ................................ 62/3.2, 3.3, 3.64, 62/3.7, 389, 391, 394; 165/145, 146

[56] References Cited

U.S. PATENT DOCUMENTS

| | | | |
|---|---|---|---|
| 2,500,519 | 3/1950 | Clark | 165/146 |
| 2,931,188 | 4/1960 | Levit | 62/391 |
| 3,008,299 | 11/1961 | Sheckler | 62/391 |
| 4,181,516 | 8/1981 | Berthet et al. | 62/3 |
| 4,188,996 | 2/1980 | Pellant et al. | 165/80 C |
| 4,201,263 | 5/1980 | Anderson | 165/146 |
| 4,829,771 | 5/1989 | Koslow et al. | 62/3.64 |
| 4,833,888 | 5/1989 | Kerner et al. | 62/3.3 |
| 4,996,847 | 3/1991 | Zickler | 62/3.64 |
| 5,072,590 | 12/1991 | Burrows | 62/3.64 |
| 5,209,069 | 5/1993 | Newnan | 62/3.64 |

FOREIGN PATENT DOCUMENTS 5269146 6/1993 Canada.

OTHER PUBLICATIONS

Mueller et al., "Photoresist Storage Unit with Fast Heat–Up Cycle", *Research Disclosure*, No. 299 (1989).
Marlow Industries Brochure for CryoTEC Series Thermoelectric Cooler (1993).
TECA Brochure, pp. 5–7; 38–39 (1992).

*Primary Examiner*—Henry A. Bennett
*Assistant Examiner*—William C. Doerrler
*Attorney, Agent, or Firm*—Oppedahl & Larson

[57] ABSTRACT

A manifold design which provides for highly efficient cooling or heating of flowing liquids using a small number of thermoelectric elements is constructed of a thermally insulting material. On exterior surface of at least two sides of the manifold, open channel are formed for use in defining a liquid flow path. On the interior of the manifold there are a plurality of internal chambers, one internal chamber for each side having an exterior channel. These internal chambers are essentially equal in size and are preferably symmetrically disposed within the manifold in alignment with the sides. The channels on the outside of the manifold and the chambers on the inside of the manifold are connected in such a way that liquid would flow in an alternating series of channel and chamber in a single liquid flow path through the manifold. The channels on the exterior of the manifold are sealed by placing a thermally conductive cover plate over each side of the manifold. A thermoelectric device is then placed on the outside of each cover plate. Finally, means for transferring heat to or from the exterior surfaces of the thermoelectric devices provided.

22 Claims, 8 Drawing Sheets

APPARATUS FOR COOLING OR HEATING LIQUIDS AND METHOD OF USING SAME

This application relates to an apparatus for cooling or heating liquids and to a method of using this apparatus, particularly in the cooling of beverages such as beer. The invention makes use of a known thermoelectric heating/cooling elements and a unique manifold design to provide efficient cooling of liquid using a system of small size.

The use of thermoelectric heating and cooling elements in devices for the cooling of beverages is known. For example, U.S. Pat. No. 5,209,069 described a beverage dispenser in which thermoelectric cooling elements are used in a cold plate located at the bottom of a large reservoir of beverage to be dispensed. The liquid is conducted in an outward spiral path over the surface of the cold plate until it reaches a riser tube where it is returned to bulk of the liquid in the vessel.

U.S. Pat. No. 4,833,888 described another use of a thermoelectric element. In this case, water flows into a reservoir, where it can be heated or cooled using a thermoelectric element in thermal contact with the stainless steel tank of the reservoir, and then dispensed through an outlet spigot mounted on a household sink.

U.S. Pat. No. 5,072,590 discloses a chilling system for bottled water. In this system, a thermoelectric element is in contact with a cold plate disposed at the bottom of the reservoir in a conventional water cooler.

U.S. Pat. No. 4,281,516 discloses a thermoelectric heat exchanger with a liquid flow path. The device includes at least one, and generally a plurality of stacks of thermoelectric elements and a tube for conducting flow into an out of the stacks in a generally spiral manner.

U.S. Pat. No. 4,829,771 discloses a thermoelectric heater/cooler in which an alternating stack of thermoelectric elements and polymer manifolds are used. Since thermoelectric elements transfer heat from one surface of the element to the other, liquid flowing across one surface of an element is cooled while liquid flowing across the opposite surface is heated. The device of the '771 patent operates the stack of thermoelectric elements that each successive element pumps heat in the opposite direction from the preceding element. In this way, the liquid in half the manifolds is heated while the liquid in the other half of the manifolds is cooled.

None of the devices described in the patents discussed above provides a cooling mechanism which is suited for use in chilling liquids on an as needed or "on demand" basis. Most of the devices involve the chilling or heating of a substantial reservoir of liquid. Further, the only device which provide for heating or cooling of a flowing material, i.e., that of the '771 patent, must use many cooling plates and thus be of large size and cost, to achieve any sort of useful efficiency.

It is the object of the present invention to provide a apparatus which can heat or cool a flowing liquid on an as-needed basis, without requiring a large apparatus or a large number of cooling plates to achieve this result.

It is a further object of the invention to provide an apparatus and a method for cooling beverages such as beer which are provided in pressurized containers on an as-needed basis.

SUMMARY OF THE INVENTION

These and other objects of the invention are achieved using a method and apparatus in which a liquid is heated or cooled by passing the liquid through a plurality of thermal transfer stages. Each of the stages consists of a thermal transfer zone in which the flowing liquid is brought into contact with a cooling element, and a mixing zone having a greater volume than the thermal transfer zone. The stages are arranged so that the liquid passes through an alternating series of thermal transfer zones and mixing zones.

In one embodiment of the invention a novel manifold design is used which provides for highly efficient cooling or heating of flowing liquids using a small number of thermoelectric elements. The manifold is constructed of a thermally insulating material. On exterior surface of at least two sides of the manifold, there are open channels formed for use in defining a liquid flow path. On the interior of the manifold there are a plurality of internal chambers, one internal chamber for each external channel. These internal chambers are essentially equal in size and symmetrically disposed within the manifold in alignment with the sides. The channels on the outside of the manifold and the chambers on the inside of the manifold are connected in such a way that liquid would flow in an alternating series of channel and chamber in a single liquid flow path through the manifold.

The channels on the exterior of the manifold are sealed by placing a thermally conductive cover plate over each side of the manifold. A thermoelectric device is then placed on the outside of each cover plate. Finally, means for transferring heat to or from the exterior surfaces of the thermoelectric devices provided.

DETAILED DESCRIPTION OF THE INVENTION

The manifold of the present invention provides very efficient heating or cooling of flowing liquids through the use of alternating regions of cooling and mixing. It is possible to do this with as few as two cooling regions, i.e., (in a manifold having the shape of a triangular prism, or two cooling regions side-by-side on one surface of an elongated manifold, although this will leave one or more exterior sides unused for cooling. In general, the preferred structure will have 4 to 6 sides used for cooling purposes. For illustration purposes, only a 4-sided structure, with all four sides used for cooling will be exemplified here.

The manifold body in accordance with the present invention is made of a thermally insulating material. For applications which involve cooling or heating of beverages the material should be a material approved for use in contact with foods. Thus, preferred materials for use in the present invention as the manifold body are acetal, CPVC and HALAR.

Figure 1:
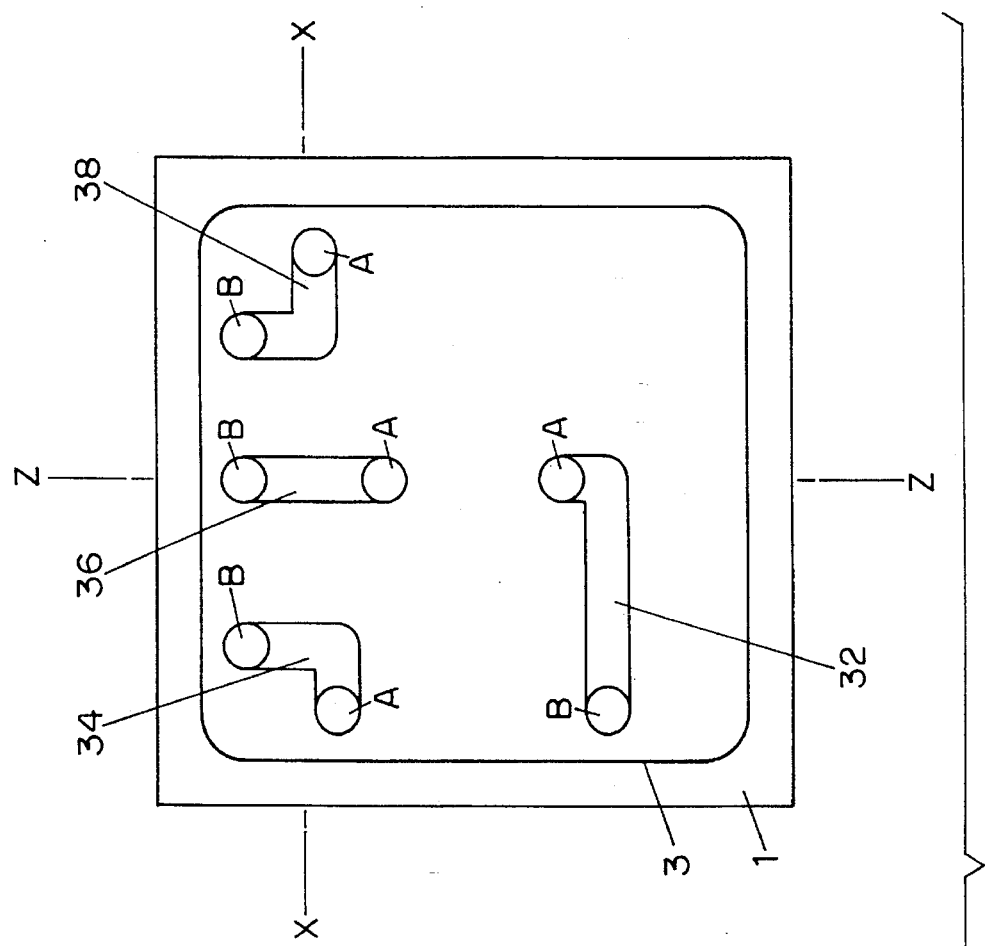
FIG. 1 shows the ends of a manifold in accordance with the invention.
Figure 1:
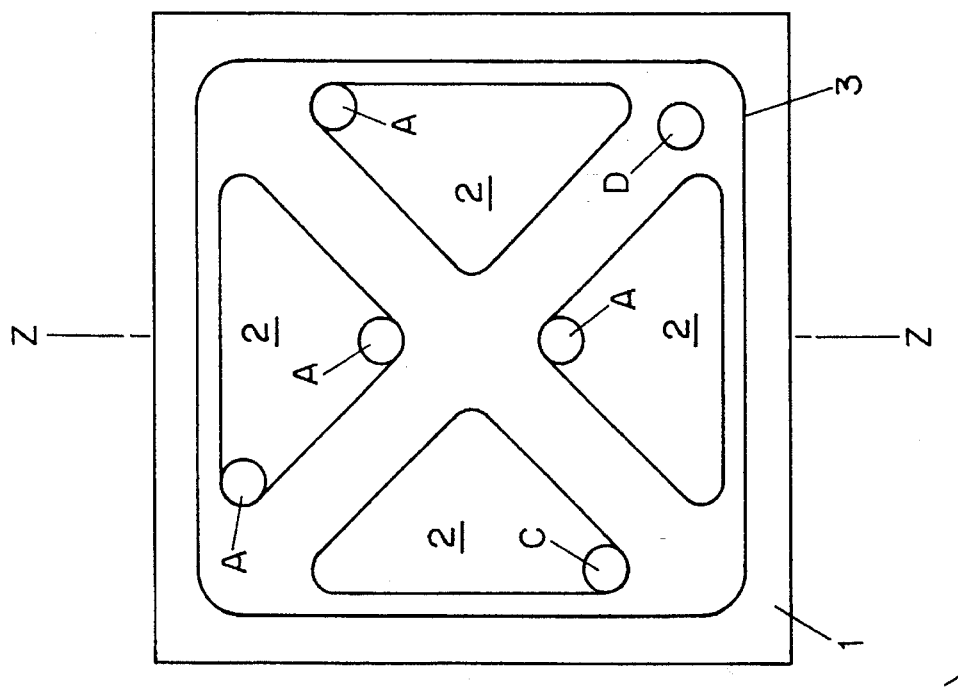

FIG. 1 shows the opposing ends of a manifold in accordance with the invention. The manifold body 1 has a square outline, and thus has four exterior sides. Within the manifold body 1, four internal chambers 2 are formed at one end extending partway through the length of the body 1. The chambers are essentially equal in size and are symmetrically aligned with the exterior sides and extend from partway through the manifold body from one end as shown more clearly in FIG. 2.

At the other end of the manifold body 1, a plurality of holes and channels are cut in the end surface to provide connection between the chambers and channels cut in the exterior side surfaces of the manifold. Both ends of the manifold also advantageously have a recess 3 formed to accept an end plate when the manifold is assembled into a complete cooling assembly.

Figure 2:
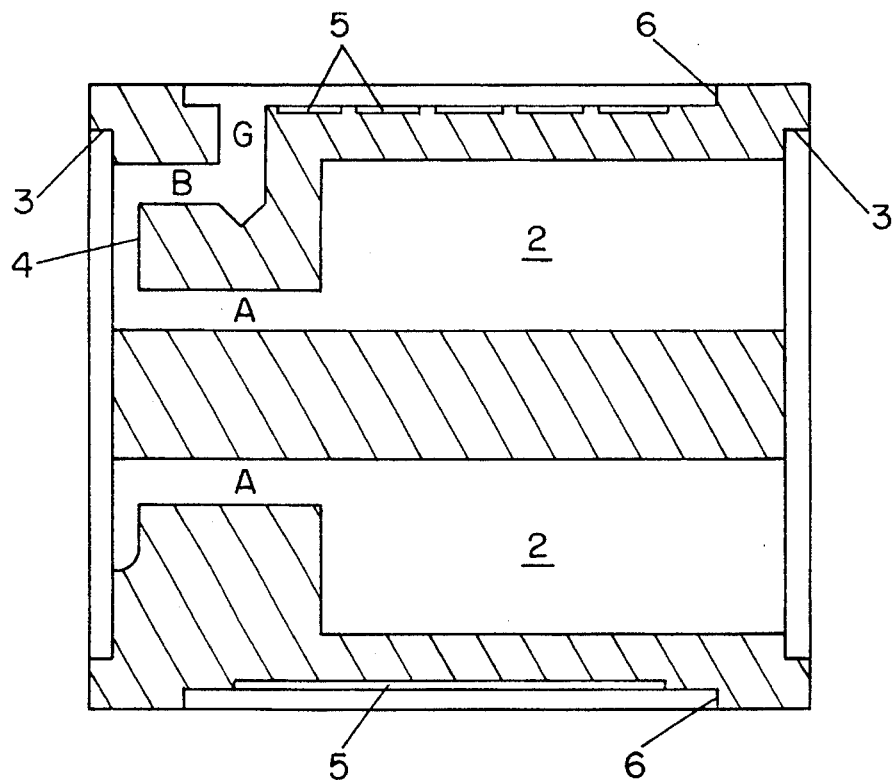
FIG. 2 shows the sides of a manifold in accordance with the invention, positioned in relationship to one end.

FIG. 2 shows a cross section of the manifold of FIG. 1 along the ZZ line. As can be seen, the holes A connect the internal chambers 2 with a channel on the end of the manifold. Connection of one of these channels 4 with the channels 5 on one exterior surface of the manifold body 1 is made via holes B and G. FIG. 2 also shows a further recess 6 which is preferably cut in the exterior side surfaces of the manifold to accept thermally conductive chiller plates.

Figure 3:
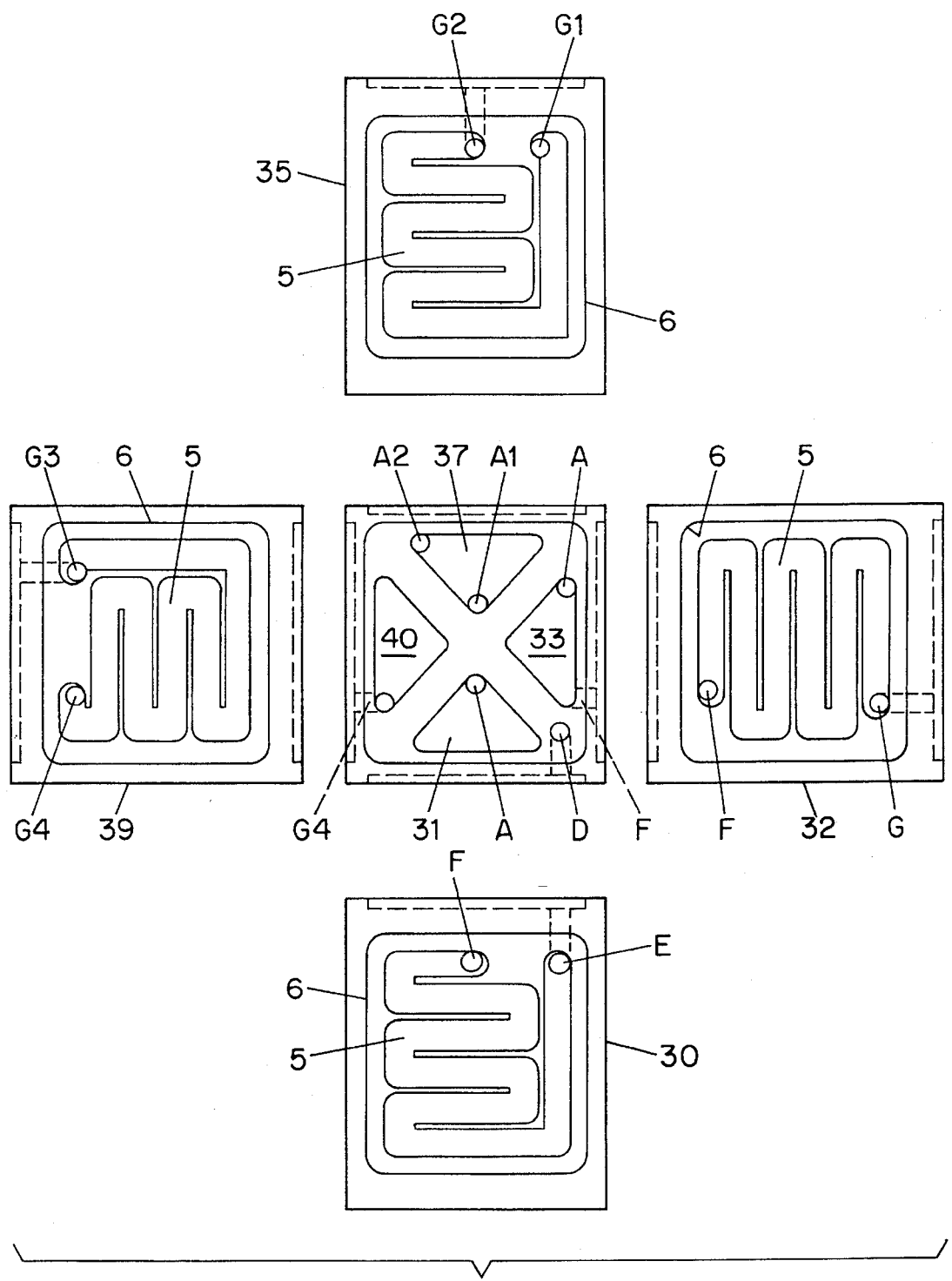
FIG. 3 shows a cross section through a manifold in accordance with the invention.

FIG. 3 shows each of the four sides of the manifold body exploded out from the sides of the end of the manifold body. As shown, each of the four sides has a serpentine channel 5, cut in its surface connecting a fluid inlet hole to a fluid outlet hole.

When the manifold is assembled into a cooling apparatus in accordance with the invention, the liquid flow path through the manifold starts at hole D on the end of the manifold body. Hole D meets hole E which is connected to the channel on the bottom side 30 of the manifold body (when oriented as shown in FIG. 1). The liquid then flows through the channel to hole F which connects the end of the channel 5 to interior of chamber 31.

Liquid leaves chamber 31 through the hole A at the back of the chamber and passes through channel 32 (FIG. 1) on the back end of the manifold to hole B. Hole B connects via hole G with the channel 5 in side 32, which in turn connects via hole F with chamber 33 in the manifold body.

Liquid leaves chamber 33 through hole A at the back of the chamber 33, which connects via channel 34 (FIG. 1) and hole G1 to the channel 5 in side 35. Channel 5 in side 35 connects via hole G2 and hole B to channel 36, and thence to chamber 37 via hole A1.

Liquid leaves chamber 37 via hole A2 to connect with channel 38 (FIG. 1) and thence via holes B and G3 with the channel 5 in side 39. The channel 5 in side 39 connects to the interior of chamber 40 via holes G4 and C. Cooled or heated liquid is removed from the manifold from chamber 40.

In FIGS. 1–3, the various holes are labeled with letters A–G to facilitate an explanation of the fabrication of the device. The device is advantageously fabricated on a milling machine by first forming the interior chambers and the channels on the sides of the chambers. The channels and chambers are then connected by drilling a plurality of holes. The 4 holes labeled as A in FIGS. 1–3 are all cut through the back end of the manifold body to connect with the interior chambers. The 4 holes labeled B are partial depth holes which extend into the back end wall but which do not reach the interior chambers. The hole labeled C is a partial depth hole which is drilled into the back wall from inside of chamber 40. The hole labeled D is a partial depth hole drilled in one corner of the manifold body. The holes labeled E, F, and G are holes drilled from a side surface of the manifold to connect with either the interior of a chamber or another hole. Finally, channels 32, 34, 36 and 38 are formed connecting the holes in the back wall.

While the manifold described above can be made from a single block of material by milling, it will be apparent that the manifold can also be fabricated in several pieces and then glued together. In this case, any adhesives used will preferably be compatible with foods uses. Examples of appropriate adhesives include CPVC Solvent Cement.

It will also be understood that the particular pattern of serpentine designs and connections shown in FIGS. 1–3 is but one embodiment of the present invention, and that different designs are within the scope of the invention provided they provide for a plurality of thermal contact regions along the exterior surface of the manifold alternated with larger volume reservoirs on the interior of the manifold. In general, the channels in the thermal contact regions should have a depth of from 0.010 to 0.120 inches, and a width of from 0.1250 to 1.00 inches. The separators between loops of the channel should be as small as possible while maintaining thermal isolation between the loops, to maximize the amount of thermal contact region which can be used to alter the temperature in the device. The separator thickness is suitably from 0.03 to 0.25 inches, and preferably about 0.062 inches.

The size of the interior chambers is selected to provide a reservoir of cooled material against which to draw. Thus, it preferably has a volume of about 4 to 16 ounces. Of course, the size is limited by the amount of material which can be removed while maintaining structural and insulative integrity.

To assemble the manifold of FIG. 1–3 into a complete apparatus for heating or cooling liquids, the next step is apply a thermally conductive chiller plate over the sides. A preferred material for use as the chiller plate is copper, although other metals which are stable in the liquid being heated or cooled may also be employed.

Figure 4:
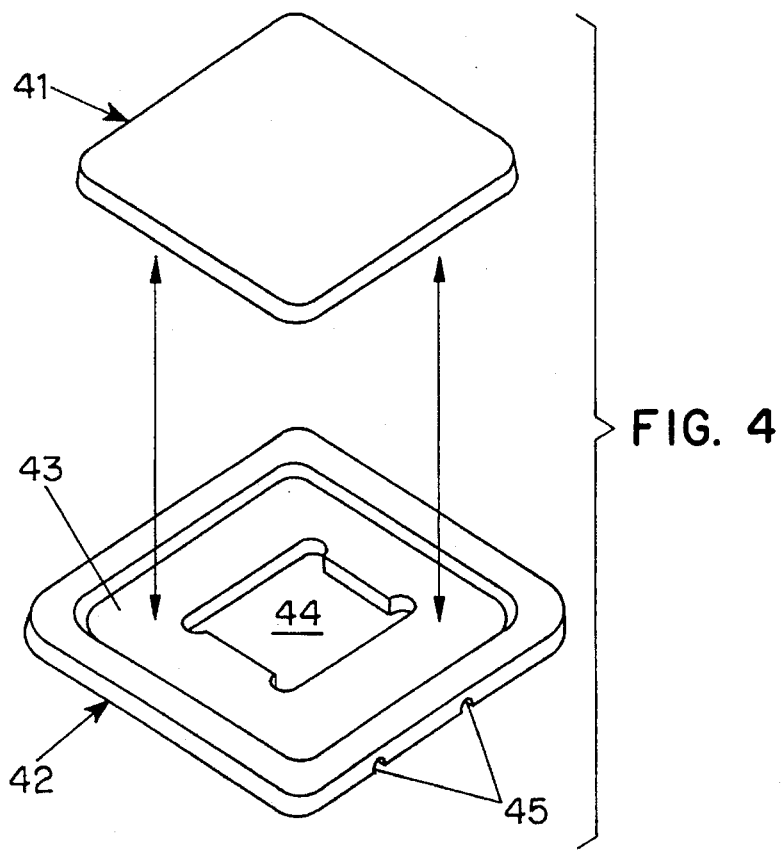
FIG. 4 shows a chiller plate and chiller plate holder useful in the apparatus of the invention.

FIG. 4 shows a preferred assembly for positioning the chiller plate 41 within recesses 6 of each side. In FIG. 4, the chiller plate 41 is fitted into a chiller plate holder 42. The holder 42 has an outside dimension selected to fit within the recess 6 on each side of the manifold. It has a further recess 43 sized to accept the chiller plate 41, and a center opening 44 sized to permit thermal contact between the chiller plate 41 and a thermoelectric element. On the underside of the holder 42 are two grooves 45 which accommodate the electrical leads from the thermoelectric element.

The chiller plate 41 is glued in place with an adhesive such as Devcon Plastic Weld, a food grade epoxy adhesive. The exposed surface of the chiller plate 41 and holder 42 are then machined to a flush condition and cemented into place on the outside of the manifold as shown in FIG. 5.

Figure 5:
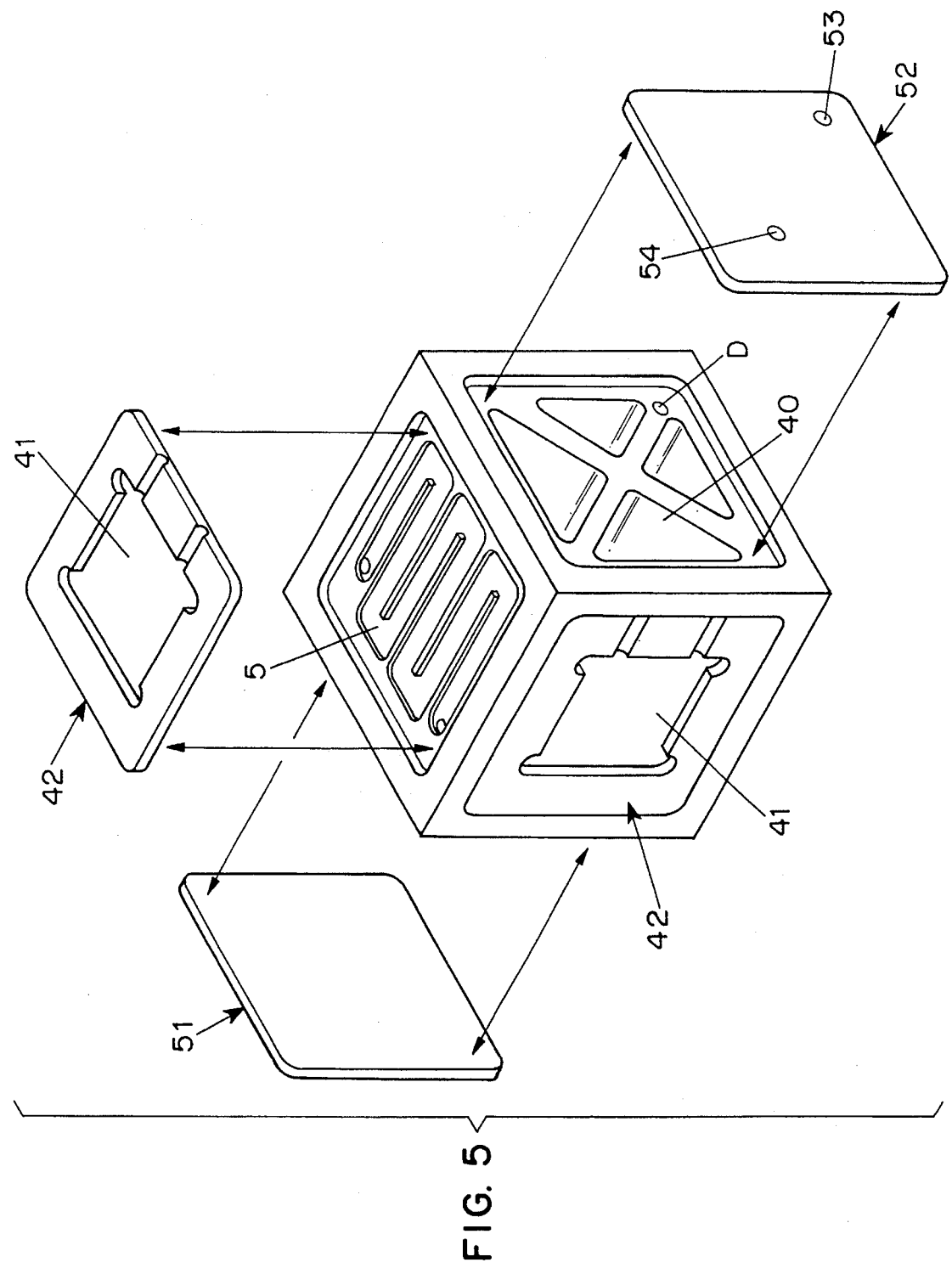
FIG. 5 shows a partially assembled apparatus according to the invention.
Figure 6:
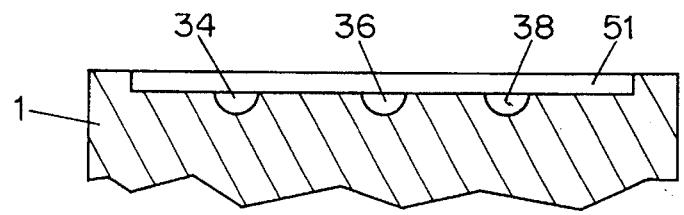
FIG. 6 shows a partial cross section of the rear end plate and part of the manifold in an apparatus in accordance with the invention.

FIG. 5 shows a partially assembled apparatus in accordance with the invention. The manifold body 1 has chiller plate 41 and chiller plate holders 42 cemented into the recesses on each of the sides so that the chiller plates 41 cooperate with the channels 5 to form the fluid flow path along each side. Rear end plate 51 is cemented over rear of the manifold body within recess 3 and cooperates with the manifold body to complete channels 32, 34, 36 and 38 as fluid flow paths, as shown generally in FIG. 6 which shows a partial cross section through the line XX in FIG. 1. A front end plate 52 is cemented within recess 3 over the openings to the interior chambers. The front end plate 52 has two holes for attachment of inlet and outlet connectors. The inlet hole 53 is positioned to line up with hole D. The outlet hole 54 is in alignment with chamber 40.

Figure 7:
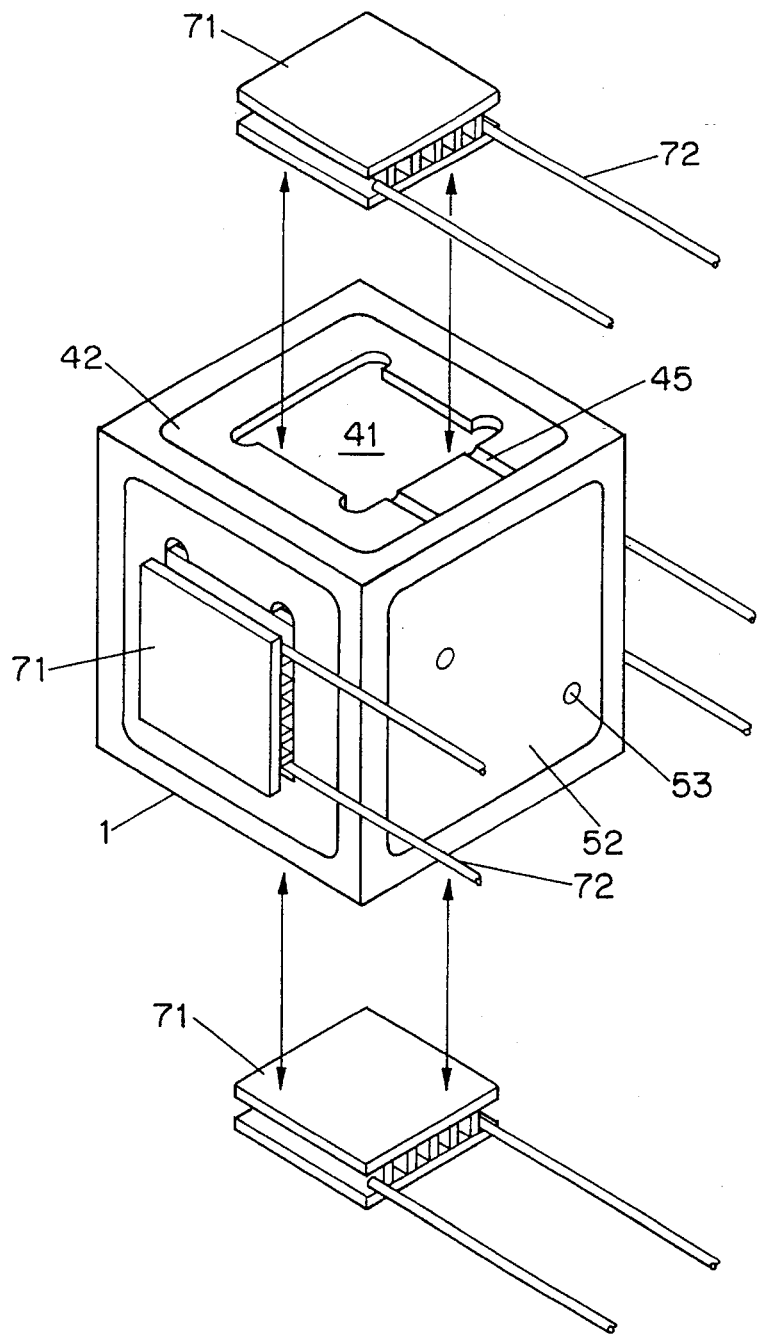
FIG. 7 shows an apparatus in accordance with the invention with the thermoelectric elements attached to the each side of the manifold.

FIG. 7 shows the apparatus of the invention with the thermoelectric elements 71 attached to the each side of the manifold over the chiller plates 41 and chiller plate holders 42. While the particular thermoelectric element used depends on the size of the apparatus being constructed, exemplary elements useful in the invention are Melcor CP-1.4-127-045L thermoelectric heat pump modules and Marlow Industries model number CT12-6. A thermally conductive paste or grease such as Thermalloy 1000 or Thermal Pads, may be included between the chiller plate 41 and the thermoelectric elements 71, after which the thermoelectric elements are glued or otherwise affixed in place. Preferred adhesives for this purpose are CPVC Weld or Devcon epoxy plastic weld, which is placed around the entire perimeter of the chiller plate 41 and over the electrical leads 72 and grooves 42.

Figure 8:
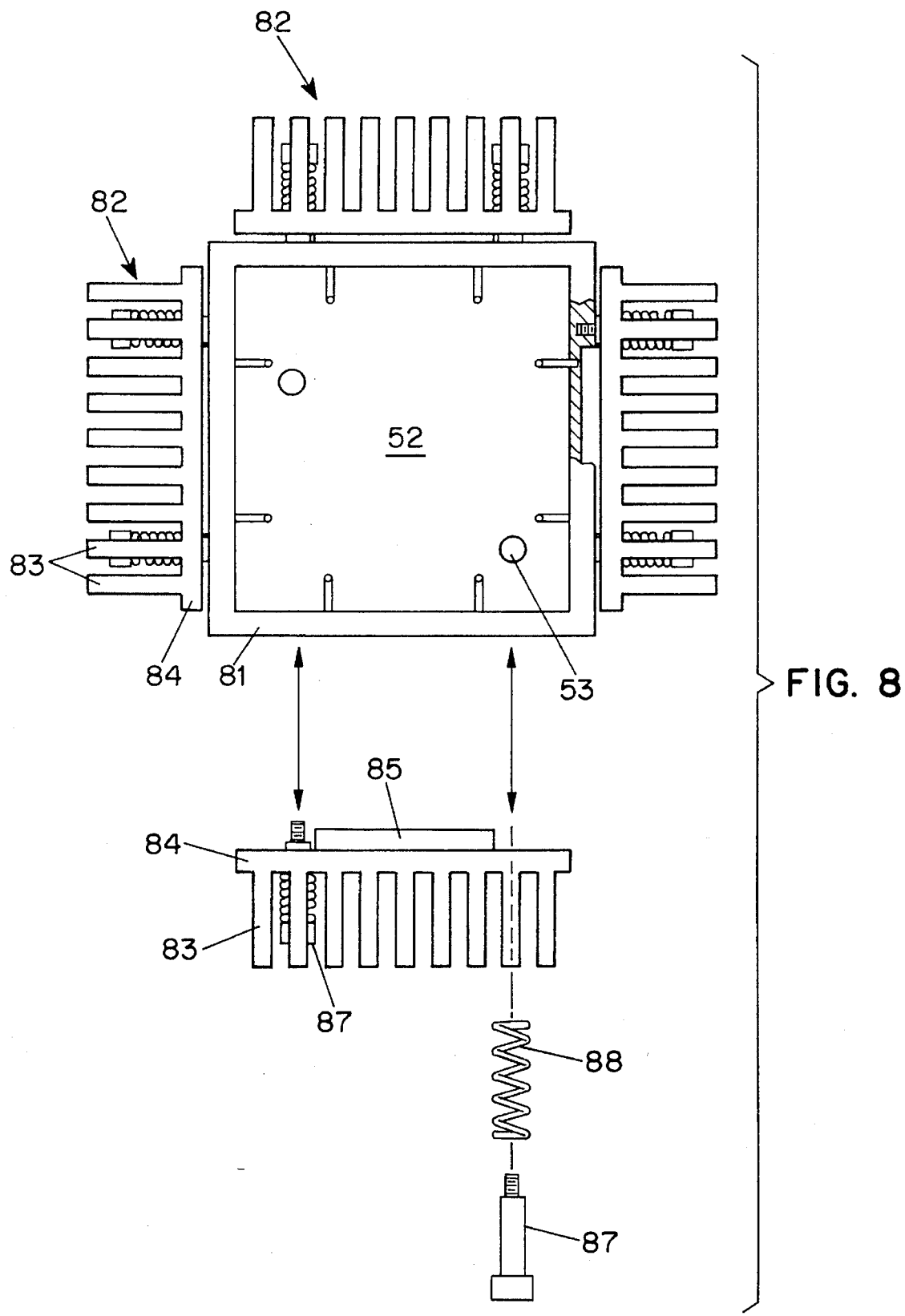
FIG. 8 shows an end view of the apparatus in accordance with the invention with heat sink fins attached to the exterior surfaces of the thermoelectric elements.
Figure 9:
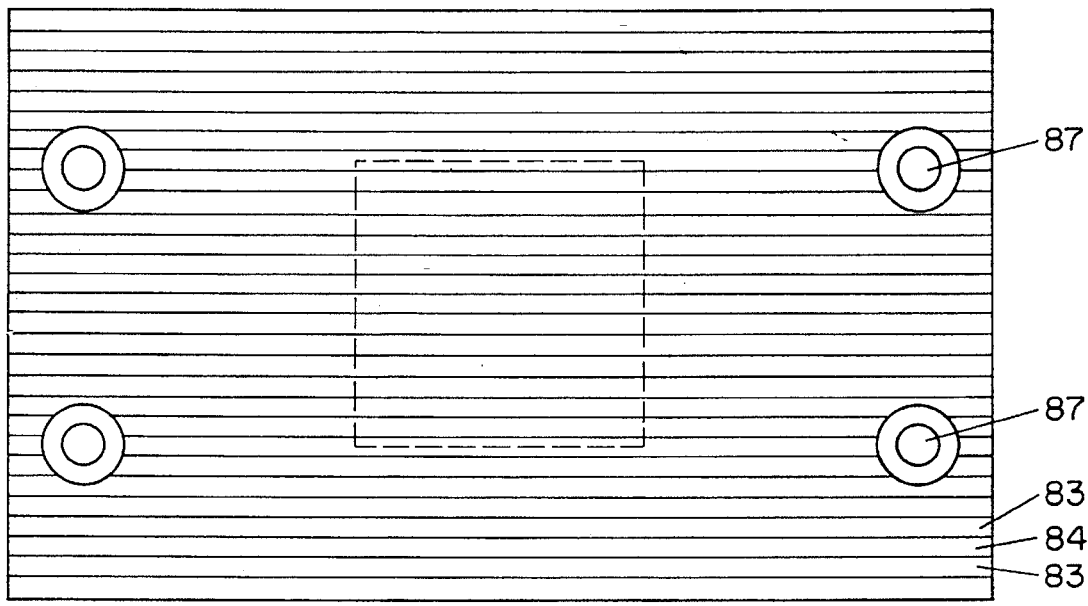
FIG. 9 shows a side view of the apparatus in accordance with the invention with heat sink fins attached to the exterior surfaces of the thermoelectric elements.

At this stage, the apparatus of the invention is operative to heat or cool liquid flowing through the manifold. Because thermoelectric elements act to pump heat from one side of the element to the other, however, it is preferred to incorporate a means for transferring heat to or from the exterior surface of the thermoelectric element. FIGS. 8 and 9 shows an apparatus in accordance with invention in which heat sink fins have been connected to the apparatus in thermal contact with the exterior surfaces of the thermoelectric elements.

In FIGS. 8 and 9, a frame 81 is disposed about each end of the manifold body to which the thermoelectric elements 71 have been attached. Heat sinks 82 are affixed to the frame 71. Each heat sink 82 is formed from an array of fins 83, a base portion 84 and a thermal contact portion 85. The thermal contact portions 85 are coupled to heat sinks 82 are brought into thermal contact with the aid of thermally conductive paste or grease.

The heat sinks 82 are affixed to the frames 81 using preformed holes 86 in each face of the frame, screws 87 and compression springs 88. A portion of the fins 83 is cut away on each heat sink 82 to accommodate the screws 87 and compression springs 88.

If further heat transfer is needed to avoid overheating or frost buildup, a fan may be mounted on one end of the frame in order to pass air over the fins 83 of heat sinks 82. A suitable fans is of the type generally referred to as a muffin fan.

The use of heat exchange fins as shown in FIGS. 8 and 9 is appropriate whenever there is no desire to recover the heat (or cooling) from the outside of the apparatus of the invention. In some cases, however, utilization of both heating and cooling may be desirable. For example, in the case where the primary function of the apparatus is to chill beer being passed through the manifold, it may be desirable to use the heat generated on the outside of the apparatus to heat water for use in the bartender's sink. In this case, the heat transfer mechanism is advantageously a liquid heat exchanger, with a flow of water through the exchanger and into the bartender's sink.

In use, the apparatus of the present invention is connected to a DC power supply, which provides current to the thermoelectric elements. In the simplest embodiment, current will always be supplied to either heat or cool the liquid passing through the manifold, and the power supply may have a simple on-off control. Preferably, however, the control system will offer more sophisticated variations.

Figure 10:
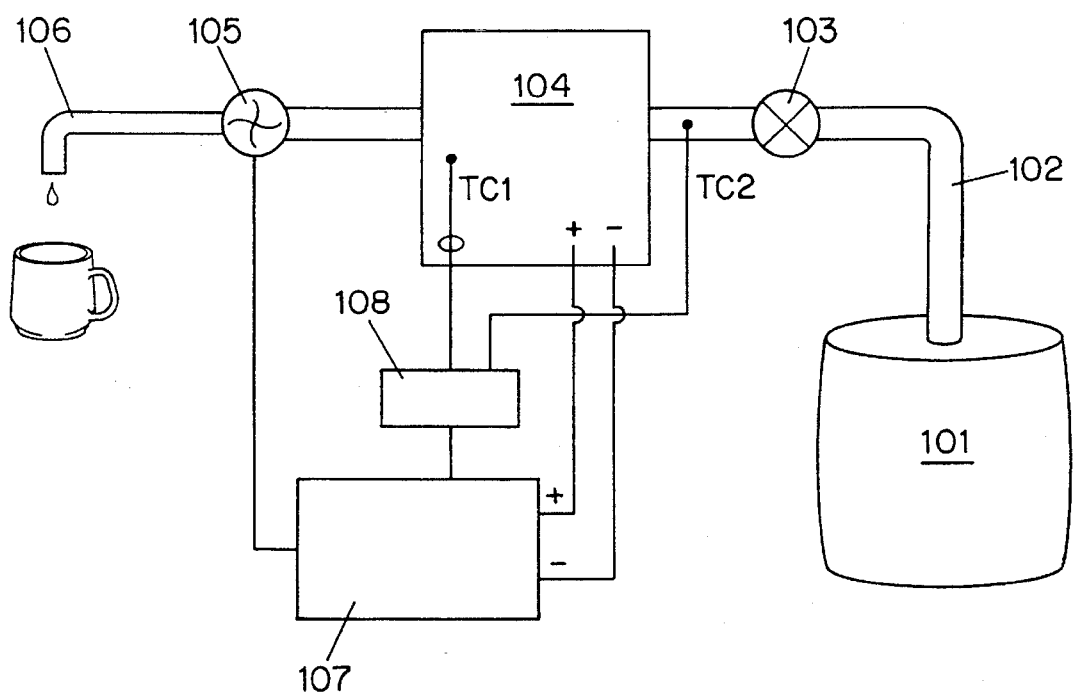
FIG. 10 shows a schematic of one embodiment of the use of the apparatus of the invention.

FIG. 10 shows a schematic of the use of the present apparatus in combination with a beer keg as the source of liquid to be cooled. In FIG. 10, beer is dispensed from keg 101 through line 102 when valve 103 is opened. In general, internal pressure in the keg 101 will be sufficient for this purpose. The flow of beer then passes through cooling assembly 104 in accordance with the invention, past a flow transducer 105 to spigot 106. Flow transducer 105 is operatively connected to power supply 107 for the thermoelectric elements in the cooling assembly 104. When valve 103 is opened, the flow of beer past the flow transducer 105 causes the power supply 107 to be switched on, starting the chilling of beer in the cooling assembly 104. When valve 103 is closed, the flow transducer 105 deactivates the power supply 108, causing the cooling action to stop. In this way, overcooling of beer within the manifold when there is no flow, and possible freezing of the beer within the manifold may be avoided.

FIG. 10 also shows optional temperatures sensors, such as thermocouples TC1 and TC2, operatively connected to the power supply 107 via temperature controller 108. Thermocouple TC1 is disposed within the cooling assembly 104. The temperature controller 108 will act to switch the power supply 107 off when a minimum temperature is reached within the cooling assembly 104 and back on when a predefined maximum temperature is reached. In this way, freezing of the liquid within the channel as a result of overcooling may be avoided even in the absence of liquid flow. Preferably, the thermocouple TC1 is located within the final channel of the manifold. The thermocouple TC2 is particularly useful where the cooling assembly is being used as a "booster" that is an additional chiller or heater In this case, the temperature of the incoming liquid also controls the operation of the power supply 107.

Figure 11:
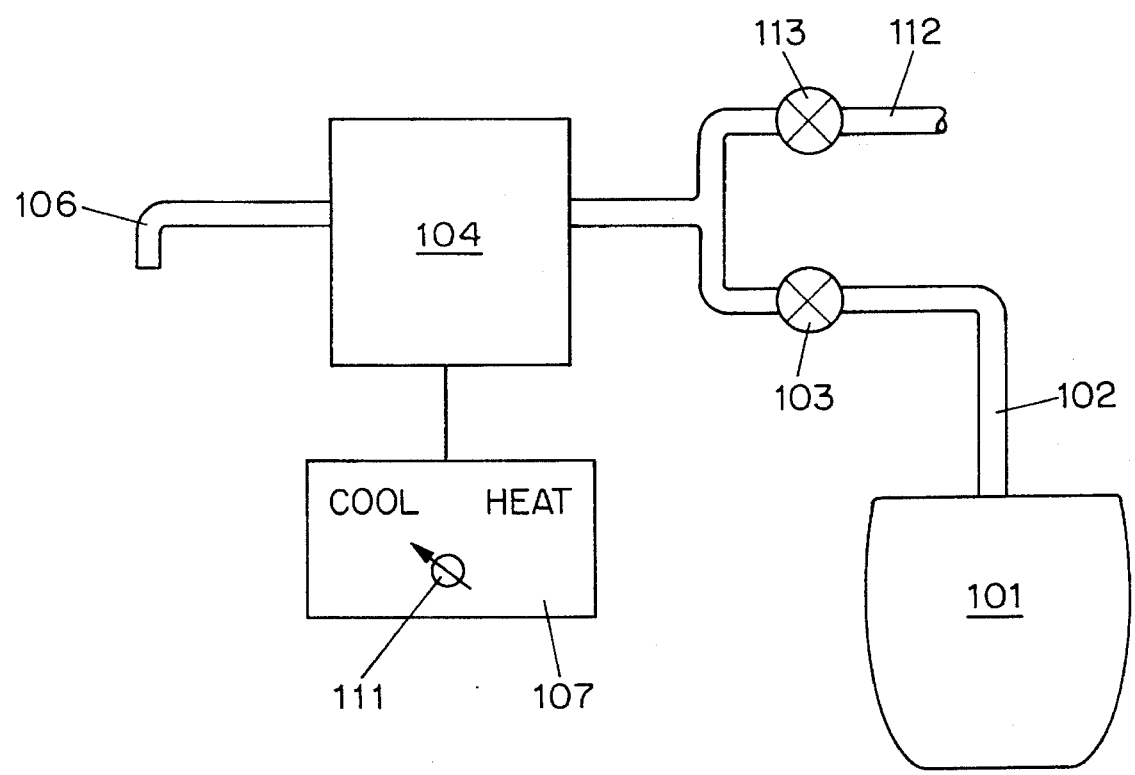
FIG. 11 shows a schematic of a further embodiment of the use of the apparatus of the invention.

A further embodiment of the invention incorporates a heating cycle for use in cleaning the interior of the manifold. In this embodiment, depicted schematically in FIG. 11, two alternative sources of liquid, the beer keg 101 and a water line 112 are connected to the cooling assembly 104. By actuation of either valve 103 or valve 113, the liquid flowing into the cooling assembly 104 is either beer or water. The power supply 108 is equipped with a switch 111 which controls the direction of flow of current through the thermoelectric elements. When the liquid flowing through the cooling assembly 104 is beer, the switch 111 is placed in the "cool" position. When it is water, the switch is placed in the "heat" position. This permits a flow of hot water to be passed easily through the manifold at regular intervals for cleaning.

While the foregoing is intended to provide a general description of the applicants' novel system for heating or cooling liquids, it will be appreciated that many additional features could be added without departing from the spirit of the invention. For example, different automated control mechanisms might be employed to control the power supply or to institute automatic cleaning cycles.

EXAMPLE

While the person skilled in the art will appreciate that the apparatus of the invention can be made in a variety of sizes depending on the throughput required, and that the precise positions and sizes of the holes and chambers formed in the manifold body will vary depending on the overall size of the apparatus, an exemplary, non-limiting set of dimensions for an apparatus in accordance with the invention is provided.

A manifold having ends which are 3.5 inches on a side and a length of 4 inches was made from acetal. The manifold body was milled to form chambers having a depth of 2.75 inches with each chamber being approximately 1.5 inches wide and 0.75 inches high. The channels in each side of the manifold body were 0.375 inches wide and 0.030 inches deep, while the channels in the rear end (32, 34, 36 and 38 in FIG. 1) had a maximum width of 0.25 inches and a maximum depth of 0.125 inches. The holes A–G were drilled with a 0.25 inch diameter bit as shown in Table 1.

TABLE 1

HOLE DEPTHS USED

| HOLE | DEPTH (inches) | COMMENTS |
|---|---|---|
| A | 1.50 | drilled from rear end to intersect interior chamber with full diameter hole |
| B | 0.84 | full diameter hole drilled from rear end, does not interior chamber |
| C | 0.54 | depth is depth of drill point from bottom of interior chamber |
| D | 0.84 | full diameter hole drilled into corner material between interior chambers |
| E | 0.63 | drilled from side to intersect hole D with full diameter hole |
| F | 0.50 | full diameter hole drilled to stated depth |
| G | 0.63 | full diameter hole drilled to stated depth |

The chiller plates were formed from 0.020 inch thick copper plates and mounted in chiller plate holders formed by machining acetal. Four Melcor CP-1.4-127-045L thermoelectric heat pump modules were thermally coupled to chiller plates. A frame was then constructed of the type shown in FIGS. 8 and 9 and fin type heat sinks fabricated of 6061 flat black anodized aluminum were thermally coupled to the thermoelectric element. The fins in these heat sinks were 1 inch long and 0.116 inches thick and were separated by a spacing of 0.125 inches. The base portion and the thermal contact portion of the heat sinks were each 0.25 inches thick. Finally, a Globe Motor A47-B15A 100 cfm fan was positioned opposite one end of the assembly at a distance of 4 inches.

The leads from the thermoelectric elements were connected to a 14 V 32A power supply and the input line affixed to the input hole (53 in FIG. 5) the front end plate (52 in FIG. 5) was coupled to a beer keg containing beer at a temperature of 23° C. The tap on the beer keg was opened at a flow rate of 0.5 ounces per second, and the temperature of the liquid exiting the cooling assembly was monitored. After a period of less tan 2 seconds, the liquid exiting the cooling assembly had achieved a steady temperature of 8° C. Assuming a heat capacity Cp for beer equal to the heat capacity of water, this corresponds to a heat transfer rate of 2746 BTU/hr or 804.3 Watts.

We claim:

1. An apparatus for cooling or heating liquids, comprising:

(a) a manifold constructed of a thermally insulating material, said manifold having first and second ends on opposing surfaces of the manifold and a plurality of sides, each of said sides being in edgewise contact with two adjacent sides and with the first and second ends, at least two of said sides having an exterior surface in which is formed an open channel for use in defining a liquid flow path, said manifold further having one internal chamber for each side having a channel formed therein, said internal chambers being equal in size, and said manifold further having internal openings formed therein connecting the internal chambers with the channels on the sides such that the chambers and channels are connected in alternating series in a single liquid flow path;

(b) one thermally conductive chiller plate for each side of the manifold with a channel formed therein, each plate having an interior surface which is affixed over one side of the manifold to close the channel thereon and an exterior surface; and (c) one thermoelectric device for each side of the manifold with a channel formed therein, each thermoelectric device having an interior surface in thermal contact with the exterior surface of one of the chiller plates and an exterior surface.

2. An apparatus according to claim 1, further comprising means for transferring heat to or from the exterior surfaces of the thermoelectric devices.

3. An apparatus according to claim 1, wherein the manifold has four sides in which channels are formed.

4. An apparatus according to claim 1, wherein the internal chambers are symmetrically disposed about an axis parallel to the sides.

5. A manifold body for use in a thermoelectric cooling or heating device comprising a body of a thermally insulating material, said body having first and second ends on opposing surfaces of the body and a plurality of sides, each of said sides being in edgewise contact with two adjacent sides and with the first and second ends, at least two of said sides each having an exterior surface in which is formed an open channel for use in defining a liquid flow path, said body further having one internal chamber for each side in which a channel is formed, said internal chambers being equal in size, and said body further having internal openings formed therein connecting the internal chambers with the channels on the sides such that the chambers and channels are connected in alternating series in a single liquid flow path.

6. A manifold according to claim 5, wherein the body has four sides with channels formed therein.

7. A manifold according to claim 5, wherein the internal chambers are symmetrically disposed about an axis parallel to the sides.

8. A manifold according to claim 7, wherein the body has four sides with channels formed therein.

9. An apparatus for heating or cooling a flowing liquid comprising an inlet port and an outlet port and a manifold of a thermally insulating material, said manifold having formed therein a plurality of thermal transfer stages, each of said stages consisting of a thermal transfer zone in which the flowing liquid is brought into contact with a heating or cooling element and a mixing zone, having a greater volume than the thermal transfer zone, said stages being arranged so that the liquid passes through an alternating series of thermal transfer zones and mixing zones.

10. A system for dispensing cold beer comprising:

(a) a vessel containing beer at ambient temperature;

(b) a thermoelectric cooling assembly connected to the vessel, said cooling assembly including a manifold for cooling the beer comprising a body of a thermally insulating material, said body having first and second ends on opposing surfaces of the body and a plurality of sides, each of said sides being in edgewise contact with two adjacent sides and with the first and second ends, at least two sides having an exterior surface in which is formed an open channel for use in defining a liquid flow path, said body further having one internal chamber for each side in which a channel is formed, said internal chambers being equal in size, and said body further having internal openings formed therein connecting the internal chambers with the channels on the sides such that the chambers and channels are connected in alternating series in a single liquid flow path;

(c) a power supply connected to the cooling assembly for energizing the thermoelectric cooling assembly; and (d) valve means for controlling flow of the beer from the vessel through the thermoelectric cooling assembly.

11. A system according to claim 10, further comprising means for connecting a water supply to the system for supplying a flow of water through the manifold, wherein the power supply includes a switch for changing the cooling assembly to a heating assembly to heat water in the manifold for cleaning.

12. A system according to claim 10, further comprising a flow monitor operatively connected to the power supply for turning the power supply on and off in response to the flow of liquid through the system.

13. A system according to claim 10, wherein the body has four sides with channels formed therein.

14. A system according to claim 10, wherein the internal chambers are symmetrically disposed about an axis parallel to the sides.

15. A system according to claim 14, wherein the body has four sides with channels formed therein.

16. A method for chilling a liquid comprising the steps of (a) introducing the liquid into a thermoelectric cooling assembly, said cooling assembly including a manifold for cooling the liquid comprising a body of a thermally insulating material, said body having first and second ends on opposing surfaces of the body and a plurality of sides, each of said sides being in edgewise contact with two adjacent sides and with the first and second ends, at least two of said sides having an exterior surface in which is formed an open channel for use in defining a liquid flow path, said body further having one internal chamber for each side having a channel formed therein, said internal chambers being equal in size, and said body further having internal openings formed therein connecting the internal chambers with the channels on the sides such that the chambers and channels are connected in alternating series in a single liquid flow path; and (b) energizing the thermoelectric cooling assembly to cool the liquid.

17. A method according to claim 16, wherein the liquid is a beverage.

18. A method according to claim 16, wherein the liquid is beer.

19. A method according to claim 16, wherein the body has four sides with channels formed therein.

20. A method according to claim 16, wherein the internal chambers are symmetrically disposed about an axis parallel to the sides.

21. A method according to claim 20, wherein the body has four sides with channels formed therein.

22. A method for chilling a liquid comprising passing the liquid through a plurality of thermal transfer stages, each of said stages consisting of a thermal transfer zone in which a flow of the liquid is brought into contact with a cooling element Which cools the flow of liquid passing through the thermal transfer zone, and a mixing zone having a greater volume than the thermal transfer zone, said stages being arranged so that the liquid passes through an alternating series of thermal transfer zones and mixing zones.

* * * * *